United States Patent
Kobayashi et al.

(10) Patent No.: US 11,193,987 B2
(45) Date of Patent: Dec. 7, 2021

(54) CONTROL SYSTEM OF INDUSTRIAL MACHINE

(71) Applicant: FANUC CORPORATION, Yamanashi (JP)

(72) Inventors: Daisuke Kobayashi, Yamanashi (JP); Takashi Idei, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 27 days.

(21) Appl. No.: 16/824,010

(22) Filed: Mar. 19, 2020

(65) Prior Publication Data
US 2020/0300925 A1   Sep. 24, 2020

(30) Foreign Application Priority Data

Mar. 20, 2019  (JP) .............................. JP2019-053006

(51) Int. Cl.
| | | |
|---|---|---|
| *H02P 8/30* | (2006.01) | |
| *G01R 31/58* | (2020.01) | |
| *H02P 6/24* | (2006.01) | |
| *H02P 6/16* | (2016.01) | |

(52) U.S. Cl.
CPC ............... *G01R 31/58* (2020.01); *H02P 6/16* (2013.01); *H02P 6/24* (2013.01)

(58) Field of Classification Search
CPC ... G01R 31/58; H02P 6/16; H02P 6/24; H02P 8/30
See application file for complete search history.

(56) References Cited

U.S. PATENT DOCUMENTS

| | | | |
|---|---|---|---|
| 2012/0176075 A1* | 7/2012 | Taka | H02P 8/30 |
| | | | 318/685 |
| 2014/0111130 A1* | 4/2014 | Yamada | B60L 3/102 |
| | | | 318/400.32 |
| 2014/0150482 A1* | 6/2014 | Ueno | H02H 7/0852 |
| | | | 62/126 |

FOREIGN PATENT DOCUMENTS

| | | |
|---|---|---|
| JP | S62-163112 A | 7/1987 |
| JP | 2000-181521 A | 6/2000 |
| JP | 2003-348870 A | 12/2003 |
| JP | 2005-149066 A | 6/2005 |
| JP | 2005-176525 A | 6/2005 |
| JP | 2005-245175 A | 9/2005 |
| JP | 2009-165267 A | 7/2009 |

(Continued)

OTHER PUBLICATIONS

An Office Action; "Notice of Reasons for Refusal", mailed by the Japanese Patent Office dated Aug. 3, 2021, which corresponds to Japanese Patent Application No. 2019-053006 and is related to U.S. Appl. No. 16/824,010; with English language translation.

*Primary Examiner* — Cortez M Cook

(74) *Attorney, Agent, or Firm* — Studebaker & Brackett PC

(57) ABSTRACT

Provided is a control system of an industrial machine that can automatically detect the presence or absence of a wiring error at a start-up of a machine, and that prevents a dangerous operation such as high rotation/high torque of a motor from occurring due to a wiring error. A control system of an industrial machine includes: a control unit that controls driving of a drive unit of the industrial machine; a command unit that issues a command to the control unit; and a wiring error detection device that detects a wiring error in a system of the control unit and the drive unit on a basis of a feedback value of actual driving of the drive unit upon a start-up of the industrial machine.

11 Claims, 4 Drawing Sheets

(56) References Cited

FOREIGN PATENT DOCUMENTS

JP  WO2014/181438 A1  2/2017
WO  2012/172647 A1  12/2012

* cited by examiner

FIG. 3

|  | NORMAL TIME | START-UP MODE |
|---|---|---|
| POSITION DEVIATION LIMIT VALUE DURING MOVEMENT (No.0001) | 160000 | 10 |
| POSITION DEVIATION LIMIT VALUE DURING STOP (No.0002) | 200 | 10 |

CONTROL SYSTEM OF INDUSTRIAL MACHINE

This application is based on and claims the benefit of priority from Japanese Patent Application No. 2019-053006, filed on 20 Mar. 2019, the content of which is incorporated herein by reference.

BACKGROUND OF THE INVENTION

Field of the Invention

The present invention relates to a control system of an industrial machine.

Related Art

For example, in the field of machine tools, by using a computer to apply CNC (Computerized Numerical Control) technology and numerically control the movement amount, moving speed etc., of a tool, repetition of the same machining procedure, machining of complicated shapes, etc. are highly automated.

Furthermore, for example, it has been known that the control system of an industrial machine such as a machine tool or a robot is configured such that a servo amplifier (control unit) is provided between the CNC (command unit) and the servo motor of the machine (drive unit) to perform feedback control on the drive of the servo motor by the servo amplifier receiving an operational command from the CNC (for example, refer to Re-publication of PCT International Publication No. WO2014/181438; Japanese Unexamined Patent Application, Publication No. 2009-165267; and Japanese Unexamined Patent Application, Publication No. 2005-176525).

On the other hand, for example, as shown in FIG. 1, if there is a wiring error among the CNC 1, the servo amplifier 2 (2a and 2b), and the servo motor 3 (3a and 3b) of the machine, unexpected operation may occur at the start-up of the machine. That is, in a case in which a plurality of servo amplifiers 2 (2a and 2b) and a plurality of motors 3 (3a and 3b) of the machine are wired through power lines 4 (4a and 4b) and feedback lines 5 (5a and 5b), if the feedback line 5 (5a and 5b) is connected to the wrong motor 3 (3a and 3b), the difference between the command value from the CNC 1 and the feedback value gradually increases, and thus, dangerous operation of high rotation/high torque may occur in the motor 3a (3b) to which the feedback line 5a (5b) should be originally connected.

Therefore, conventionally, some of the control systems of the industrial machines are configured to issue an alarm (warning) before unexpected operation reaches a dangerous level in order to avoid an accident, etc. due to a wiring error of the motor 3 which is a drive unit of a machine tool, robot or the like.

Patent Document 1: Japanese Re-Publication of PCT Application Publication No. WO2014/181438
Patent Document 2: Japanese Unexamined Patent Application, Publication No. 2009-165267
Patent Document 3: Japanese Unexamined Patent Application, Publication No. 2005-176525

SUMMARY OF THE INVENTION

Here, in order to prevent the motor from driving with a dangerous operation of high rotation/high torque due to such a wiring error, an instruction such as "Unless the machine is properly connected and set, unexpected operation may occur. Therefore, when operating the machine for the first time after the machine is assembled, a component is replaced, or a parameter is changed, please pay close attention to the operation by, for example, lowering the torque limit value, lowering the excessive error level, lowering the operation speed, or operating in a manner in which the emergency stop can be immediately applied" is provided in the servo parameter manual or the like to attract attention of users (operators) of the industrial machine.

However, since the operation of lowering the threshold of the alarm so that the alarm is issued before the unexpected operation reaches a dangerous level is generally performed by the user of the industrial machine, it is impossible to completely eliminate the user forgetting to lower the threshold of the alarm. If the user forgets to lower the threshold of the alarm, the motor may be driven with a dangerous operation such as high rotation/high torque at the start-up of the machine.

Therefore, it has been strongly desired to develop a system and a means or method whereby it is possible to automatically detect the presence or absence of a wiring error at the start-up of the machine, and that prevents dangerous operation such as high rotation/high torque of the motor from occurring due to the wiring error.

According to an aspect of the present disclosure, a control system of an industrial machine includes: a control unit that controls driving of a drive unit of the industrial machine; a command unit that issues a command to the control unit; and a wiring error detection device that detects a wiring error in a system of the control unit and the drive unit on a basis of a feedback value of actual driving of the drive unit upon a start-up of the industrial machine.

According to one aspect of the present invention, it is possible to automatically detect a wiring error between the drive unit and the control unit of an industrial machine such as a machine tool or a robot at the start-up of the machine, and to prevent unexpected operation in the machine from occurring due to the wiring error.

BRIEF DESCRIPTION OF THE DRAWINGS

FIG. 3 is a diagram showing an example of a position deviation limit value (alarm detection threshold) during normal operation and start-up mode.

DETAILED DESCRIPTION OF THE INVENTION

Hereinafter, a description will be given of a control system of an industrial machine according to an embodiment of the present disclosure with reference to FIGS. 1 to 4.

Herein, although the present embodiment will be described with the industrial machine being a machine tool, the present invention is applicable to any machine having a drive unit whose drive is automatically controlled by a control unit, such as an industrial robot.

Figure 1:
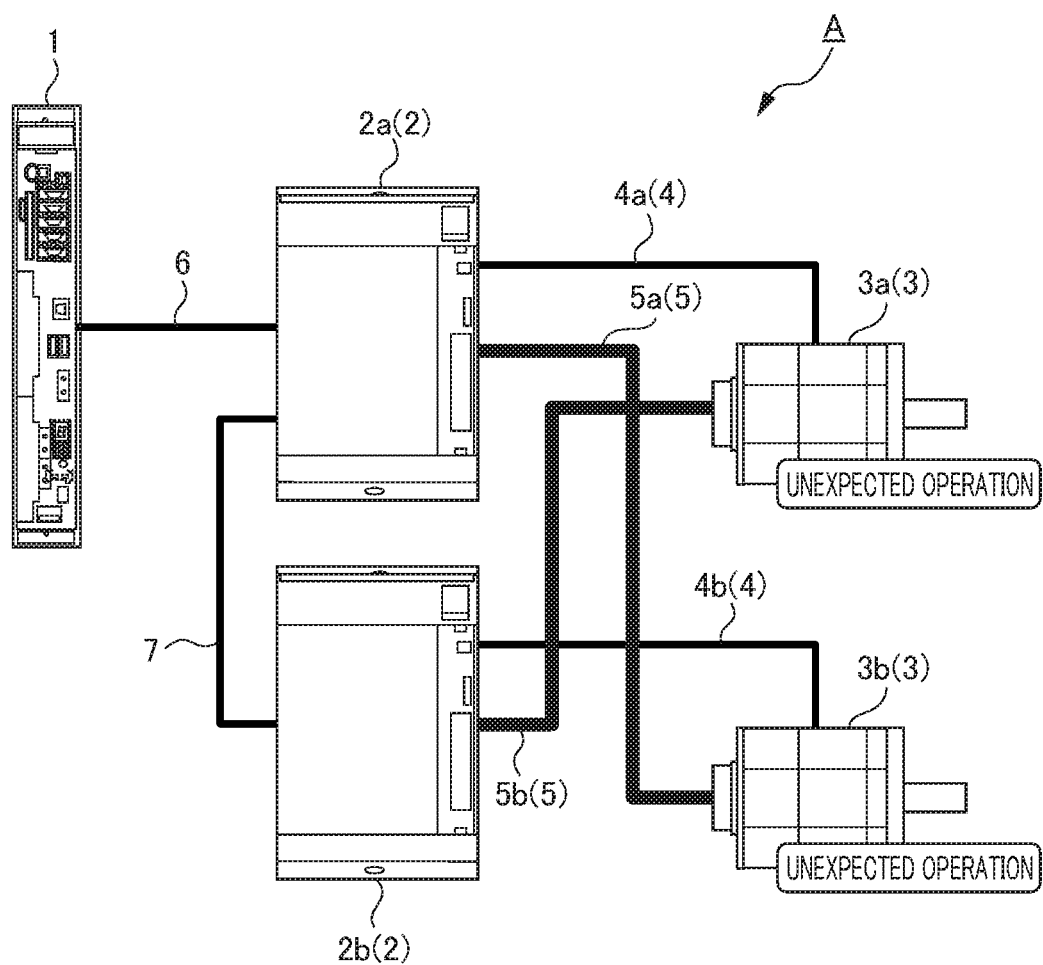
FIG. 1 is a diagram showing a control system of an industrial machine according to an embodiment.

As shown in FIG. 1, a control system A of a machine tool of the present embodiment (control system of an industrial machine) includes: a servo motor 3 (motor) (drive unit) of the machine tool such as an NC lathe or a machining center, a servo amplifier 2 (control unit) for controlling the drive of the motor 3 of the machine tool, and a CNC 1 (command unit) (computerized numerical control unit) (superordinate control unit) for controlling the entire control system A of the machine tool as a superordinate unit of the servo amplifier 2.

The control system A of the machine tool of the present embodiment includes: a plurality of machine tools (a plurality of servo motors 3 (3a and 3b)) and a plurality of servo amplifiers 2 (2a and 2b), in which a pair of the servo motors 3 (3a and 3b) and a pair of the servo amplifiers 2 (2a and 2b) of the machine tool are connected through power lines 4 (4a and 4b) and feedback lines 5 (5a and 5b).

It should be noted that, in the present embodiment, the CNC 1 and one servo amplifier 2a are connected through a signal line 6, and the plurality of servo amplifiers 2a and 2b are connected through a signal line 7. With such a configuration, the CNC 1 and the plurality of servo amplifiers 2 (2a and 2b) are directly and indirectly connected.

FIG. 1 shows a state in which the feedback line 5a that would originally connect the servo amplifier 2a with the servo motor 3a connects the servo amplifier 2a with the servo motor 3b, and the feedback line 5b that would originally connect the servo amplifier 2b with the servo motor 3b connects the servo amplifier 2b with the servo motor 3a, thereby causing a wiring error.

Figure 2:
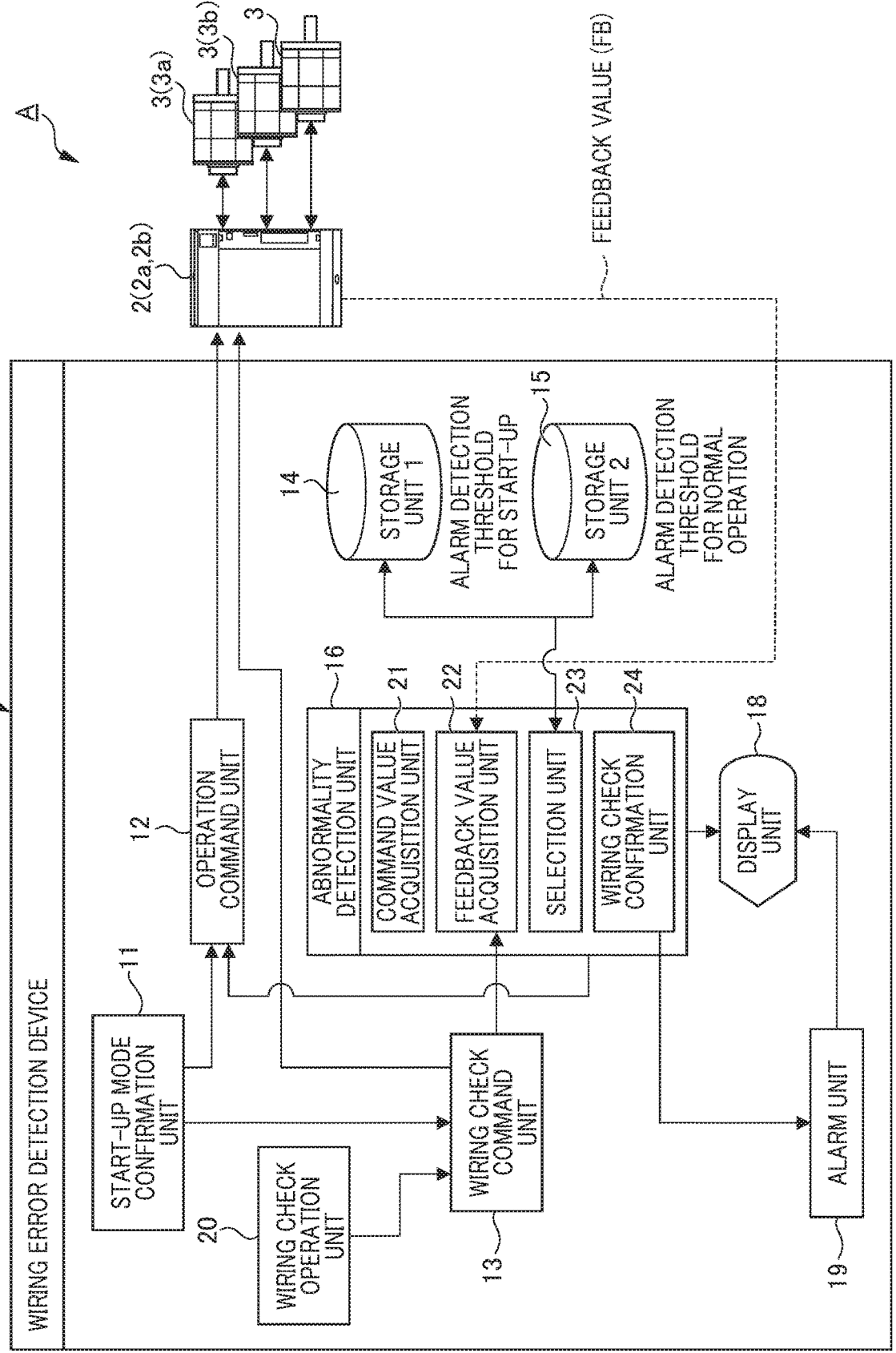
FIG. 2 is a diagram showing a control system and a wiring error detection device of an industrial machine according to an embodiment.
Figure 4:
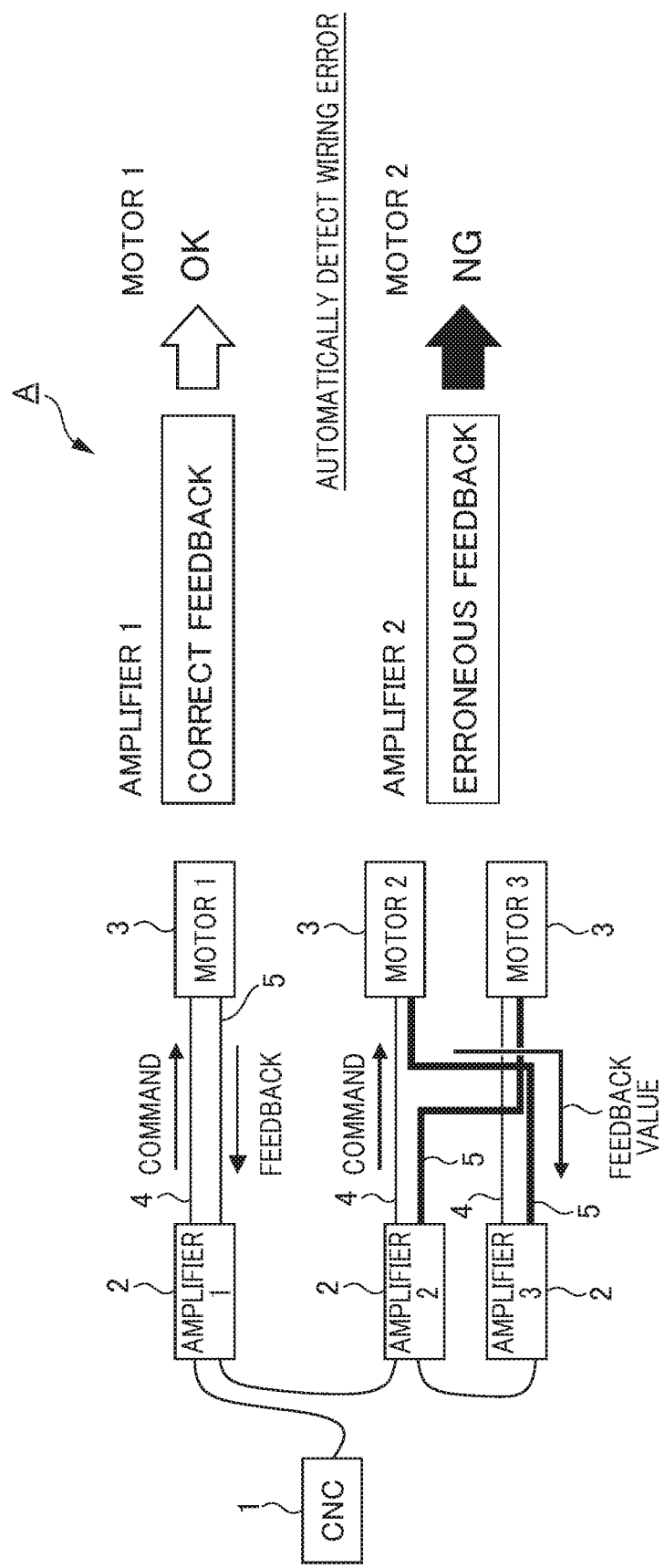
FIG. 4 is a diagram used for describing a detection method of a wiring error by a control system of an industrial machine according to an embodiment.

On the other hand, as shown in FIG. 2, the control system A of the machine tool of the present embodiment includes a wiring error detection device 10 for detecting a wiring error (wiring error in the system) between the servo amplifier 2 and the servo motor 3 of the machine tool. It should be noted that the wiring error detection device 10 may be incorporated into the CNC 1, or alternatively may be provided separately.

The wiring error detection device 10 includes a start-up mode confirmation unit 11, an operation command unit 12, a wiring check command unit 13, storage units 14 and 15, an abnormality detection unit 16, a display unit 18, an alarm unit 19, and a wiring check operation unit 20.

The start-up mode confirmation unit 11 detects a start-up operation of the machine, and confirms and identifies whether the start-up operation is in a normal operation mode or in a start-up mode.

In a case in which it is confirmed that the start-up operation is in the normal operation mode by the start-up mode confirmation unit 11, the operation command unit 12 receives the detection result, and outputs an operation command to the servo motor 3 via the servo amplifier 2 of the control unit.

In a case in which a wiring error has not been detected in the abnormality detection unit 16 to be described later in detail, the operation command unit 12 receives the detection result from the abnormality detection unit 16, and starts and continues the operation control of the machine in accordance with a command value from the CNC 1.

The wiring check command unit 13 detects the start-up operation of the machine in the start-up mode confirmation unit 11 and receives the detection result, and outputs a command for performing a wiring check to the servo amplifier 2 and the abnormality detection unit 16.

The storage units 14 and 15 each store the alarm detection threshold (or torque limit value) for the normal operation mode and the alarm detection threshold (or torque limit value) for the start-up mode.

The abnormality detection unit confirms and identifies the presence or absence of a wiring error between the servo amplifier 2 and the servo motor 3, and includes a command value acquisition unit 21, a feedback value acquisition unit 22, a selection unit 23, and a wiring check confirmation unit 24.

The command value acquisition unit 21 receives a command of the wiring check from the wiring check command unit 13, and acquires a command value from the CNC 1 (for example, a drive command value such as the rotation number or torque of each servomotor motor 3, the position command value of each servo motor 3, etc.).

The feedback value acquisition unit 22 receives a command of the wiring check from the wiring check command unit 13, and acquires a feedback value indicating the driving state of the actual drive of each servo motor 3. In the present embodiment, the position deviation which is the difference between the current position and the command value of the servo motor (drive unit) 3 is a feedback value. The feedback value may be a value corresponding to the command value from the CNC 1 (for example, the current position of each servo motor 3).

At this time, the feedback value acquisition unit 22 includes, for example, a timer, and is configured to acquire a feedback value of a fixed time during which a measurement value can be stably and accurately measured at a time when the driving of the servo motor 3 has started and after a fixed dead time set in advance has elapsed (time after a fixed time has elapsed). It should be noted that it may be configured to acquire feedback values respectively at a plurality of times at any time zone when the driving of the servo motor 3 has started and after a fixed dead time set in advance has elapsed (a plurality of times of any time zone after a fixed time has elapsed).

The selection unit 23 selectively acquires an alarm detection threshold for the start-up mode and an alarm detection threshold for the normal operation from the storage units 14 and 15. With such a configuration, as shown in FIG. 3, in the start-up mode, even if the user (the operator) of the machine does not change the settings, the alarm detection threshold for the start-up mode is automatically set. That is, the threshold of the alarm decreases. In addition, during the normal operation, the threshold of the alarm automatically becomes the alarm detection threshold for the normal operation. That is, the alarm threshold increases.

The wiring check confirmation unit 24 identifies the presence or absence of a wiring error by the size of the feedback value (position deviation) acquired in the feedback value acquisition unit 22. That is, the presence or absence of the wiring error is identified by comparing the feedback value with the alarm detection threshold set in advance.

For example, in a case in which the position deviation of the feedback value exceeds the allowable value, it is determined that the wiring error has occurred, and in a case in which the position deviation satisfies the allowable value, it is determined that a wiring error has not occurred. The allowable value is an alarm detection threshold for the start-up mode, and is acquired from the storage unit 14.

Here, in a case in which the feedback value is a value corresponding to the command value from the CNC 1, the wiring check confirmation unit 24 calculates the difference between the command value acquired by the command value acquisition unit 21 and the feedback value, and identifies the presence or absence of a wiring error on the basis of whether the difference has exceeded the allowable value set in advance (alarm detection threshold). For example, the wiring check confirmation unit 24 may be configured to detect a wiring error by comparing a feedback value that is the current position of the servo motor 3 with a command value (the position command value of the servo motor 3) issued from the CNC 1.

In a case in which it is determined that a wiring error has occurred in the abnormality detection unit 16, the alarm unit 19 emits a warning sound or lights a warning lamp on the basis of the result, and displays that a wiring error has occurred in the display unit 18 to notify the operator or the like. In addition, control is performed so as to prevent an unexpected dangerous operation/abnormal operation from occurring in the servo motor 3 due to the wiring error. More specifically, control is performed so as to avoid raising the threshold of the alarm to the normal operation alarm threshold, and thus, avoid shifting to the normal operation mode.

In a case in which it is determined that no wiring error has occurred in the abnormality detection unit 16, the result is sent to the operation command unit 12. Thereafter, the operation command unit 12 detects that the machine normally starts up, and issues a command to the servo amplifier 2 so as to perform a normal operation in accordance with the command value of the CNC 1.

In a case in which it is determined that no wiring error has occurred in the abnormality detection unit 16, the display unit 18 displays the normal state to notify the operator or the like of the normal state.

Furthermore, in a case in which it is determined that no wiring error has occurred in the abnormality detection unit 16, the selection unit 23 acquires an alarm detection threshold for the normal operation from the storage unit 15, and replaces the alarm detection threshold in the normal operation after start-up with the alarm detection threshold for the normal operation, thereby automatically increasing the threshold of the alarm.

Here, in the control system A of the machine tool of the present embodiment, a wiring check operation unit 20 is provided to the wiring error detection device 10 and, by operating the wiring check operation unit 20 irrespective of whether it is at the time of the start-up of the machine, the wiring check command unit 13 issues a command, and performs the wiring check in the same manner as described above.

With such a configuration, it is possible to perform the wiring check by operating the wiring check operation unit 20 at any timing at which the wiring check is desired to be performed, for example, when only a part of the wiring work of the system is completed, or when the replacement work of the maintenance parts is performed.

That is, in the control system A of the machine tool of the present embodiment, as described above, the start-up mode (wiring check mode) is provided, and the threshold (or torque limit value) of the alarm is automatically lowered to the value for the start-up mode internally held by the CNC 1.

In addition, the CNC 1 sends a command and confirms the feedback value to perform the wiring check. In a case in which the wiring states of all the servo motors 3 are correct, the start-up mode ends, and is switched to the normal operation mode. In a case in which there is an abnormality in the wiring state of the servo motor 3, a warning is issued from the alarm unit 19 or an abnormal state is displayed on the display unit 18.

Therefore, by the control system A of an industrial machine such as a machine tool according to the present embodiment including the wiring error detection device 10 for detecting a wiring error in the system on the basis of a feedback value, and furthermore, by the wiring error detection device 10 comparing a threshold set in advance for detecting a wiring error, a feedback value (or a difference between a command value and a feedback value), and an alarm detection threshold to thereby detect a wiring error, it is possible to automatically detect a wiring error between the servo motor 3 of the drive unit and the servo amplifier 2 of the control unit at the start-up of the machine or the like, and thus it is possible to prevent unexpected operation from occurring on the machine due to the wiring error.

Furthermore, the wiring error detection device 10 includes the start-up mode confirmation unit 11 that, detects an start-up operation of the machine and confirms whether it is in the normal operation mode or in the start-up mode; the abnormality detection unit 16 for detecting the presence or absence of a wiring error in the system; and the wiring check command unit 13 that outputs, upon the start-up mode confirmation unit 11 detecting the start-up operation of the machine and receiving the detection result, a command for performing the wiring check to the servo amplifier 2 and the abnormality detection unit 16.

With such a configuration, upon starting up the machine, it is possible to automatically detect wiring error between the servo motor 3 of the drive unit and the servo amplifier 2 of the control unit, and thus it is possible to reliably prevent an unexpected operation from occurring on the machine due to a wiring error.

Furthermore, the wiring error detection device 10 includes: the command value acquisition unit 21 that receives a command of the wiring check from the wiring check command unit 13 and acquires a command value; the feedback value acquisition unit 22 that acquires a feedback value; the selection unit 23 that selectively acquires a threshold for the start-up mode and a threshold for the normal operation stored in the storage units 14 and 15; and the wiring check confirmation unit 24 that specifies the presence or absence of the wiring error by comparing the feedback value with the threshold for the start-up mode.

With such a configuration, upon starting up the machine, it is possible to automatically detect a wiring error between the servo motor 3 of the drive unit and the servo amplifier 2 of the control unit by using the threshold for the start-up mode, and thus it is possible to reliably prevent an unexpected operation from occurring on the machine due to a wiring error. Furthermore, upon being switched to the normal operation mode, it is possible to detect the presence or absence of abnormality using the threshold for the normal operation. It should be noted, when the machine starts up in the start-up mode, and wiring error detection by the wiring error detection device 10 is performed on all of the servo motors 3 (drive unit), if there is no wiring error in all of the servo motors it may be configured such that the mode is automatically switched to the normal operation mode.

Next, in the present embodiment, the feedback value acquisition unit 22 is configured to acquire a feedback value during a fixed time since the drive of the servo motor 3 starts and after the actual drive of the servo motor 3 is stabilized.

With such a configuration, the wiring check is not performed on the basis of the feedback value acquired in the state in which the actual drive of the servo motor 3 immediately after the start-up operation of the machine is not stable, it is possible to perform a highly reliable wiring error check.

Furthermore, the wiring error detection device 10 includes the wiring check operation unit 20 that causes a command for performing the wiring check at any timing to be outputted from the wiring check command unit 13 to the servo amplifier 2 and the abnormality detection unit 16.

With such a configuration, irrespective of the start-up of the machine, the wiring check command unit 13 can issue a command by operating the wiring check operation unit 20, thereby making it possible to perform the wiring check. For example, it is possible to perform the wiring check by operating the wiring check operation unit 20 at any timing at which the wiring check is desired to be performed, for example, when only a part of the wiring work of the system is completed, or when the replacement work of maintenance parts is performed.

Therefore, according to the control system A of the industrial machine of the present embodiment, even if an unexpected operation occurs due to a wiring error, it is still possible to stop at a safe level. In addition, the wiring error can be detected automatically by the wiring check.

Although an embodiment of the control system of the industrial machine according to the present invention has been described above, the present invention is not limited to the one embodiment described above, and can be modified where appropriate within a scope that does not deviate from the spirit.

For example, in the present embodiment, a description has been given in which the plurality of control units (servo amplifier 2) and the plurality of drive units (servo motor 3) are provided, and a wiring error of the feedback line 5 is detected in a case in which the pairs of the control unit and the drive unit are connected to each other through both the power line 4 and the feedback line 5. In contrast, the control system of the industrial machine according to the present invention is also applicable to a case in which one control unit and one drive unit are provided. For example, in a case in which a three-phase motor (three-phase: UVW) is mistakenly wired, it is possible to detect a wiring error of the three-phase motor by acquiring a feedback value of the three-phase motor and comparing the feedback value with a command value (or a threshold). Therefore, it is possible to obtain the same operational effect as the present embodiment.

Furthermore, it may be configured to allow the start-up mode at any timing.

Furthermore, in order to prevent the machine from performing a dangerous operation at the start-up of the machine, it may be configured to start up the machine in a start-up mode in which the alarm threshold or torque limit value is forcibly lowered.

Furthermore, as in the present embodiment, in a case in which the plurality of servo motors 3 (drive unit) is provided in the system of the control system A of the industrial machine, it is preferable to configure such that the feedback value of the actual drive of the servo motor 3 is acquired from all of the servo motors 3. In a case in which there is a wiring error in the system, incorrect feedback (feedback value) may be obtained not only from the servo motor 3 that has sent a command, but also from the other servo motors 3. Therefore, by configuring all of the servo motors 3 as the acquisition object of the feedback value as described above, it is possible to detect a wiring error more precisely and accurately.

Furthermore, the torque limit value at the time of sending the wiring error detection command (start-up mode) may be set at a value of an extent that the machine can move to the position commanded.

EXPLANATION OF REFERENCE NUMERALS

1 CNC (numerical control unit, command unit, superordinate control unit)
2 servo amplifier (control unit)
3 servo motor (drive unit)
4 power line
5 feedback line
6 signal wire
7 signal wire
10 wiring error detection device
11 start-up mode confirmation unit
12 operation command unit
13 wiring check command unit
14 storage unit
15 storage unit
16 error detection unit
17 start-up mode forced termination unit
18 display unit
19 alarm unit
20 wiring check operation unit
21 command value acquisition unit
22 feedback value acquisition unit
23 selection unit
24 wiring check confirmation unit
A control system of industrial machine

What is claimed is:

1. A control system of an industrial machine configured to operate in a start-up mode and a normal operation mode, the control system comprising:
   a control unit that controls driving of a drive unit of the industrial machine;
   a command unit that issues a command to the control unit; and
   a wiring error detection device that detects a wiring error in a system of the control unit and the drive unit on a basis of a feedback value of actual driving of the drive unit upon the industrial machine being in the start-up mode.

2. The control system of the industrial machine according to claim 1, wherein the wiring error detection device detects a wiring error by comparing the feedback value which is a current position of the drive unit with a command value issued from the command unit.

3. The control system of the industrial machine according to claim 1, wherein the wiring error detection device detects a wiring error by comparing a position deviation of the feedback value which is a difference between a current position of the drive unit and a command value issued from the command unit, and an alarm detection threshold of a position deviation that is set in advance for detecting a wiring error.

4. A control system of an industrial machine configured to operate in a start-up mode and a normal operation mode, the control system comprising:
   a control unit that controls driving of a drive unit of the industrial machine; and
   a command unit that issues a command to the control unit,
   wherein, in order to prevent a machine from performing a dangerous operation at a start-up of the industrial machine, the control system is configured to start up the machine in the start-up mode in which an alarm threshold or a torque limit value is forcibly lowered.

5. The control system of the industrial machine according to claim 4, further comprising a wiring error detection device that detects a wiring error in a system of the control unit and the drive unit on a basis of a feedback value of actual driving of the drive unit,
   wherein, in a case in which the industrial machine starts up in a start-up mode, and a wiring error detection by the wiring error detection device is performed on the drive unit, if there is no wiring error in the drive unit, the control system is configured such that a mode is automatically switched to the normal operation mode.

6. The control system of the industrial machine according to claim 5, wherein the wiring error detection device includes:
- a start-up mode confirmation unit that detects a power supply operation of a machine, and confirms whether the mode is in the normal operation mode or in the start-up mode in which an alarm detection threshold or a torque limit value is set to be lower than an alarm detection threshold or a torque control limit in the normal operation mode;
- an abnormality detection unit that detects presence or absence of a wiring error in the system of the control unit and the drive unit on a basis of a feedback value in the start-up mode; and
- a wiring check command unit that causes, upon the start-up mode confirmation unit detecting a start-up operation of the machine and receiving a detection result, a command for performing a wiring check to be outputted from the command unit to the control unit and the abnormality detection unit.

7. The control system of the industrial machine according to claim 6, wherein the command unit acquires the feedback value at a time after a fixed time has elapsed since driving of the drive unit has started or at a plurality of times of any time band after the fixed time has elapsed, and the command unit detects a wiring error in the system of the control unit and the drive unit on a basis of the feedback value.

8. The control system of the industrial machine according to claim 6, further comprising a wiring check operation unit that causes a command for performing wiring check at any timing to be outputted from the wiring check command unit to the control unit and the abnormality detection unit.

9. The control system of the industrial machine according to claim 1, wherein a plurality of drive units is provided in a system of a control system, and the control system is configured such that a feedback value of actual driving of the drive unit is acquired from each of the plurality of drive units.

10. The control system of the industrial machine according to claim 6, wherein the mode is switched to the start-up mode at any timing.

11. The control system of the industrial machine according to claim 6, wherein normal operation is not possible in the start-up mode.

* * * * *